United States Patent
Endrino et al.

(10) Patent No.: US 8,318,328 B2
(45) Date of Patent: Nov. 27, 2012

(54) HIGH OXIDATION RESISTANT HARD COATING FOR CUTTING TOOLS

(75) Inventors: Jose Endrino, Berkeley, CA (US); Volker Derflinger, Feldkirch (AT); Christoph Gey, Balzers (LI)

(73) Assignee: Oerlikon Trading AG, Trubbach, Trubbach (CH)

( * ) Notice: Subject to any disclaimer, the term of this patent is extended or adjusted under 35 U.S.C. 154(b) by 845 days.

(21) Appl. No.: 11/572,118

(22) PCT Filed: Jul. 14, 2005

(86) PCT No.: PCT/CH2005/000404
§ 371 (c)(1),
(2), (4) Date: Apr. 12, 2008

(87) PCT Pub. No.: WO2006/005217
PCT Pub. Date: Jan. 19, 2006

(65) Prior Publication Data
US 2008/0318062 A1    Dec. 25, 2008

Related U.S. Application Data

(60) Provisional application No. 60/588,084, filed on Jul. 15, 2004.

(51) Int. Cl.
*B32B 9/00* (2006.01)

(52) U.S. Cl. ....... 428/697; 51/307; 51/309; 204/192.15; 204/192.16; 428/698; 428/699

(58) Field of Classification Search .................... 51/307, 51/309; 428/697, 698, 699, 701, 702, 704; 204/192, 192.15, 192.16
See application file for complete search history.

(56) References Cited

U.S. PATENT DOCUMENTS

| | | | |
|---|---|---|---|
| 6,586,122 B2 * | 7/2003 | Ishikawa et al. | 428/698 |
| 6,824,601 B2 * | 11/2004 | Yamamoto et al. | 428/699 |
| 2002/0053322 A1 | 5/2002 | Seeli | |

FOREIGN PATENT DOCUMENTS

| | | | |
|---|---|---|---|
| JP | 06-322517 | * | 11/1994 |
| JP | 10-025566 A | | 1/1998 |
| JP | 2002-160129 A | | 6/2002 |
| JP | 2002-337005 A | | 11/2002 |
| JP | 2002-337007 A | | 11/2002 |
| WO | 2004/059030 A2 | | 7/2004 |

OTHER PUBLICATIONS

English translation of JP 2002-337007.*

(Continued)

*Primary Examiner* — Archene Turner
(74) *Attorney, Agent, or Firm* — Pearne & Gordon LLP

(57) ABSTRACT

An inventive workpiece features on at least parts of its surface a wear resistant hard coating comprising the following composition $Al_{1-a-b-c-d}Cr_aX_bSi_cB_dZ$, where x is at least one element from Nb, Mo, W or Ta; Z is one element or compound from N, C, CN, NO, CO, CNO; and $0.2<=a<=0.5$; $0.01<=b<=0.2$; $0<=c<=0.1$; $0<=d<=0.1$. Further a PVD process for depositing such a wear resistant coating is disclosed whereby at least one workpiece is installed in a vacuum coating system and said system is operated in a low pressure argon atmosphere utilizing at least two metal or metal alloy targets with at least temporarily addition of a reactive gas.

15 Claims, 7 Drawing Sheets

OTHER PUBLICATIONS

G.E. D'Errico, E. Guglielmi, G. Rutelli: "A study of coatings for end mills in high speed metal cutting" Journal of Materials Processing Technology, vol. 92-93, Aug. 30, 1999, pp. 251-256, XP002369227, p. 253, last para.; p. 255, last sent.

Wuhrer R. et al: "A comparative study of magnetron co-sputtered nanocrystalline titanium aluminium and chromium aluminium nitride coatings" Scripta Materialia, Elsevier, Amsterdam, NL, vol. 50, No. 12, Jun. 2004, pp. 1461-1466, XP004502701, ISSN: 1359-6462, abstract; figure 9.

E. Lugscheider, K. Bobzin and K. Lackner, "Investigations of Mechanical andTribological Properties of CrAlN+C thin Coatings Deposited on Cutting Tools," Surface and Coatings Technology, 174-175 (2003) 681-686.

E. Uhlmann, E. Wiemann, S. Yang, J. Drumeich and A. Layyous, "New Coating Development for High Performance Cutting Tools," 4th THE coatings, 2004, p. 111-120.

* cited by examiner a)

b)

c)

(a)

(b)

(c)

US 8,318,328 B2

HIGH OXIDATION RESISTANT HARD COATING FOR CUTTING TOOLS

CROSS REFERENCE TO RELATED APPLICATION

This application is a 371 of PCT/CH2005/000404, which was published in English.

FIELD OF THE INVENTION

The invention relates to a hard coating with extremely high oxidation resistance for a body that especially requires wear-protection. It further relates to a coated tool, especially a high speed steel, a cemented carbide or a cubic boron nitride (CBN) coated cutting tools such as end mills, drill bits, cutting inserts, gear cutters and hobs. In consequence the invention also relates to coated wear resistant machine parts, in particular mechanical components such as pumps, gears, piston rings, fuel injectors, etc.

RELATED ART

Document A (JP 2002-337007), titled "hard coating coated tool" describes the presence of fine amorphous CrAlSiN particles in a CrAlN coating which provides high oxidation resistance to the cutting tool. Document B, EP 1 422 311 A2 refers to a Al-rich CrAlSi (NBCO) coating having a NaCl-type crystal structure. JP 2002-337005, document C, describes a tool with an abrasive-resistant coating wherein at least one layer is made of CrAlN and another layer is made of a sort of CrSiBN. Document D, JP 2002-160129 describes a tool with an interlayer made of Ti, Cr, Si or Al-based material which is then coated with an AlCrN based hard film. JP 10-025566, document E, refers to a CrAlN coating with properties in high temperature oxidation resistance. The scientific article (document F) by Lugscheider et al. in Surface & Coatings Technology v. 174-175 pp. 681-686 (2003) refers to investigations of mechanical and tribological properties of CrAlN+C thin coatings deposited on cutting tools, especially to CrAlN+C coatings with low friction tribological performance reported to have a beneficial effect for cutting and drilling applications. The proceedings of the 4th Int'l Conf. THE Coatings in Manuf. Engineering pp. 111-120 (2004), by Uhlmann et al. report new developments for high performance cutting tools (document G). The paper refers to the deposition of multilayered CrN/TiAlN, CrMoTiAlN and CrAlVN hard coatings.

In [A], [B] and [C], hard anodic coatings are composed with at least one of silicon or oxygen containing CrAl based system layer which is responsible for the increase in the degree of hardness and the increase in high temperature oxidation resistance, reducing the rate of abrasive and oxidation wear on cutting tools. In [D], a base material is first coated with a layer of Ti, Cr, Si or Al and an AlCrN hard layer is formed on top. The metal intermediate layer is used as a buffer deformation absorption layer to even out any deformation due to the difference in thermal expansion between coating and the tool. In [E], a hard AlCrN coating is formed by physical vapor deposition from Al and Cr targets on a reactive nitrogen atmosphere, the heat resistance of the AlCrN system is reported up to 1000° C. In [F], the authors report an improvement in the mechanical properties (such as hardness and increased Young's modulus) and frictional characteristics by combining CrAlN coating with a hard carbon surface. It is claimed such combinations could be successful in drilling and milling applications. In [G], the authors refer to multilayer CrAlVN coatings deposited as layers combining chromium, aluminum and vanadium metal sources by the ion plating process. As a result, the machining performance of the deposited coatings did not reach the level obtained by standard TiAlN coatings.

SUMMARY OF THE INVENTION

The invention targets at low wear resistance layers of TiCN, TiAlN, AlTiN, and similar hard coatings especially in high speed cutting applications where high temperatures are involved, difficult to machine materials applications (for example, machining of tool steels, austenitic stainless steel, aluminum and titanium alloys). Despite the beneficial effects of known CrAlN coatings with high temperature applications, alternatives should be found which might give an even better performance for certain applications with tools, especially with cutting and forming tools or components, especially with components used for combustion engines.

The performance of CrAlN coatings could be optimized by the addition of transition metals like niobium, tantalum, molybdenum and/or tungsten. Optionally metalloids like silicon and/or boron can be added to further increase the hardness and decrease the wear of tools and mechanical components running under the described extreme conditions. The new family of coatings increases the service life of tools and reduces the costs of replacing mechanical components and/or re-sharpening expensive cutting tools by influencing chip formation process, consequently, an increased productivity would be reached due to higher possible cutting speeds.

DETAILED DESCRIPTION OF THE INVENTION

Figure 1:
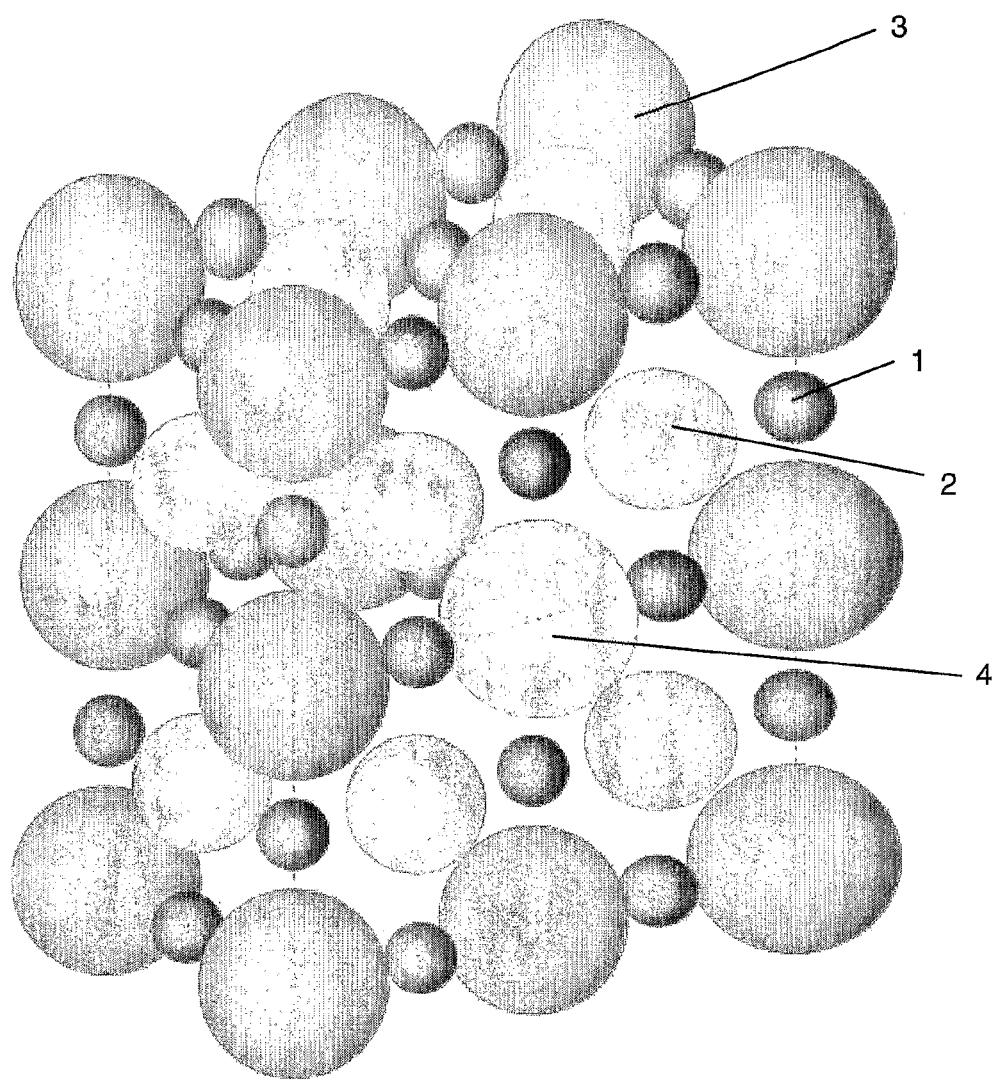
FIG. 1: Sketch of the crystal structure of aluminum-chromium-transition metal nitride.

The alloyed-AlCrN coatings were obtained using an industrial Baizers rapid coating system (RCS) machine. This machine contains a low voltage arc discharge arrangement that allows for rapid heating and etching of the substrates which promotes high adhesion strengths. The apparatus is also equipped with six deposition sources which can be chosen from sputtering, cathodic arc and nano-dispersed arc jet sources. During the deposition, a negative bias voltage can be applied to the substrate tools or components by using a fixed or a pulsed bias power supply The entire description and drawings of the RCS equipment can be found under US appl. no. US 2002/0053322.

To deposit the inventive coatings on a variety of workpieces, the previously cleaned workpieces were mounted, according to their diameter, either on double-rotating or, for diameters under 50 mm, on triple-rotating substrate carriers. Radiant heaters installed in the coating system heated up the workpieces to a temperature of about 500° C. and, with a bias voltage of −100 to −200 V applied in an Argon atmosphere at a pressure of 0.2 Pa, the workpieces surfaces were subjected to etch polishing with Ar-ions. The coating system is operated in a low pressure argon atmosphere utilizing at least two metal or metal alloy targets with at least temporarily addition of at least one reactive gas, applying at the substrate a negative voltage.

A workpiece, for the purpose of this invention, is being defined as having a body made from steel, high speed steel, hardmetal, cemented carbide, or any other suitable metal or ceramics. An example for a workpiece may be a tool for high temperature and/or dry tooling operation. Examples for tools are a cutting tool, a drill, a reamer, a broach, an insert, a hob, a mill, an endmill, a ball nose mill, a forming tool, a die casting mold, an injection mold, a stamping tool, a deep drawing tool, a forging die. Besides tools the invention can be applied to components, e.g. for heavy duty, high temperature, insufficient lubrication and/or dry running conditions. Such components comprise a tappet, a component of the valve train, a bucket tappet, a valve lever, a rocker arms, a pin, a piston pin, a roller follower pin, a bolt, a component of a fuel injection system, an injection needle, a gear, a pinion gear, a plunger, a piston ring. This listing is not terminating, further embodiments and applications of the invention are possible and can be defined by a man skilled in the art.

In the experiments relating to this invention, two of the six deposition sources were used to include a ductile TiN adhesion layer (around 0.3 μm thick). Some of the experiments were repeated using miscellaneous adhesion layers like Ti, Cr and CrN and a similar performance was reached. The remaining four sources were utilized to deposit the main functional layer using customized sintered aluminum-chromium-transitional metal targets and the ion plating deposition process. Also, in some of the experiments, the main functional layer was co-deposited by combining an AlCr alloyed with a transition metal and an AlCr containing silicon or boron. During the deposition, the sources were run at a power of 3.5 kW while the partial pressure of the nitrogen gas was maintained at approximately 3.5 Pa. Also, a substrate bias of −100V was applied during the deposition to enhance the ion bombardment process on the substrates. The deposition time was always adjusted so that for all different coating compositions, the thickness of the functional layer was around 4 μm.

A total of ten customized compositions for the sintered targets were prepared. The aluminum atomic content for all the targets of all the compositions was fixed at 70%. One customized composition was composed of 30 at. % Cr, eight customized compositions were composed of 25 at. % Cr and 5 at. % of Ti, Y, V, Nb, Mo, W, Si and B, respectively, and one composition was composed by 20 at. % Cr and 10 at. % Mo. The composition of the coatings correlated proportionally to the compositional analysis of the targets used (as it is shown in examples 1 through 4).

The desired cubic crystal structure for an AlCrN coating containing small amounts of alloying elements is represented in FIG. 1. In a pure AlCrN coating, the NaCl (B1) crystal structure is composed of anion nitrogen atoms 1 as well as of aluminum 2 and chromium 3 atoms that compete for the available cation positions. In theory, with the addition of small amounts of a different transition metal (TM) 4, the lattice structure should get slightly distorted due to the difference in atomic size and electronegativity. Also, the amount of solid solution solubility would be limited because most transition metals have much lower capacity than chromium to stabilize the B1 structure in the presence of large amounts of aluminum atoms. Another factor affecting the solubility of solute TM atoms is the atomic radius difference between the TM and aluminum and chromium which should not be larger than 15% to achieve real solid solution strengthening. Indeed, depending on the nature of the transition metal alloy utilized solute atoms may restrict or not the movement of dislocations due to a resulting lattice distortion effect.

Figure 2:
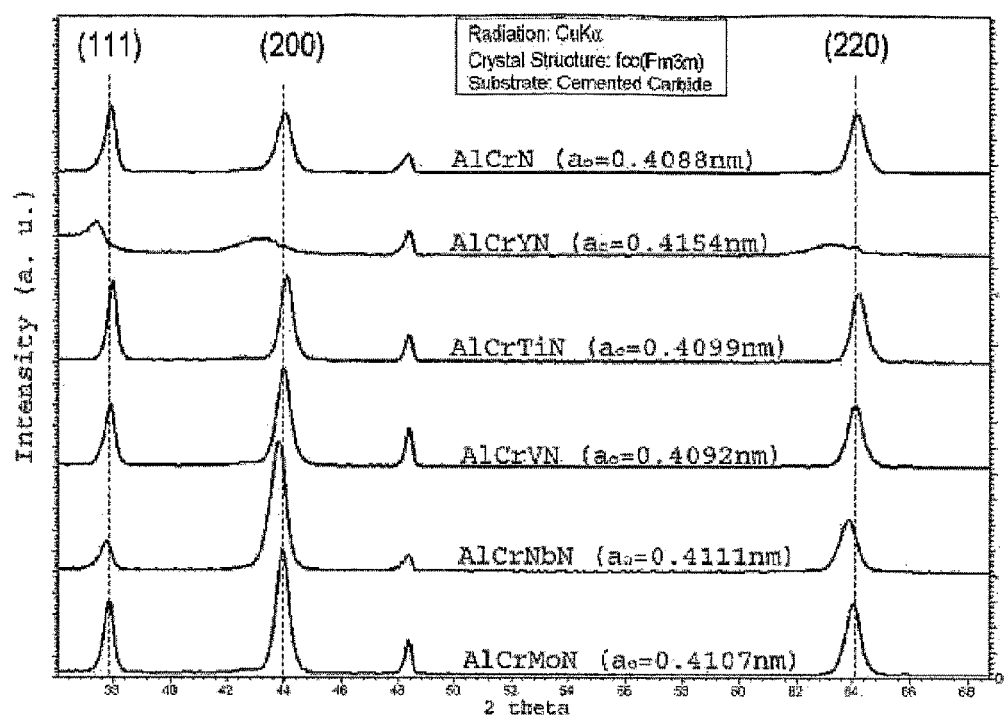
FIG. 2: X-ray diffraction pattern and lattice parameter of aluminum-chromium-transition metal nitrides.

The x-ray diffraction patterns and measured lattice parameters of a variety of AlCr-TM-N coatings are shown in FIG. 2. With the exception of AlCrYN, the coatings showed a distinct B1 structure similar to the one expected for cubic AlCrN. This fact underscores the importance of the atomic radius and electronegativity of the alloying element not only on the solubility of the solute TM atoms but on the structural phase stability of the overall crystal structure. So, the differences in the measured lattice parameters can indeed provide us unique information about the structural effects of transition metal doping. The XRD experiments show that in the case of AlCrTiN and AlCrVN, the lattice parameter is slightly larger but similar to pure AlCrN. However, in the case of AlCrNbN and AlCrMoN, the lattice has slightly expanded (around 0.02 Å) while maintaining a B1 crystal structure. However, in the case of AlCrYN, AlCrHfN and AlCrZrN, the TM's are expected to have very small solubility due to their relatively large atomic size. In this case, the result is an amorphisation of the microstructure, as shown in FIG. 2 for AlCrYN.

Figure 3:
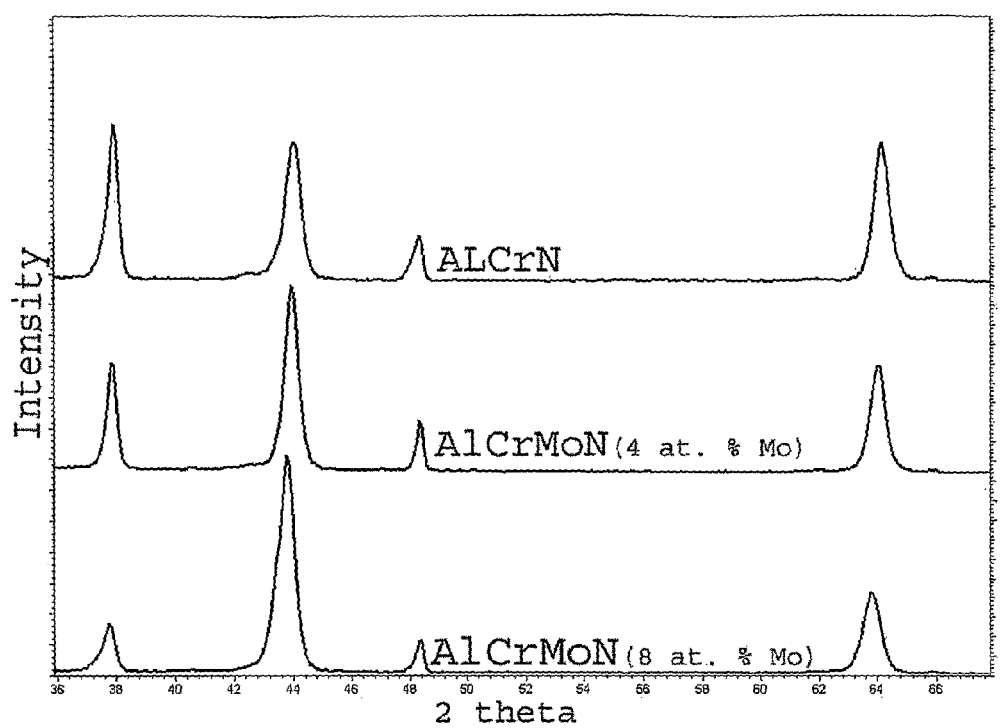
FIG. 3: X-ray diffraction pattern and texture coefficient of aluminum-chromium-molybdenum nitrides.
Figure 4:
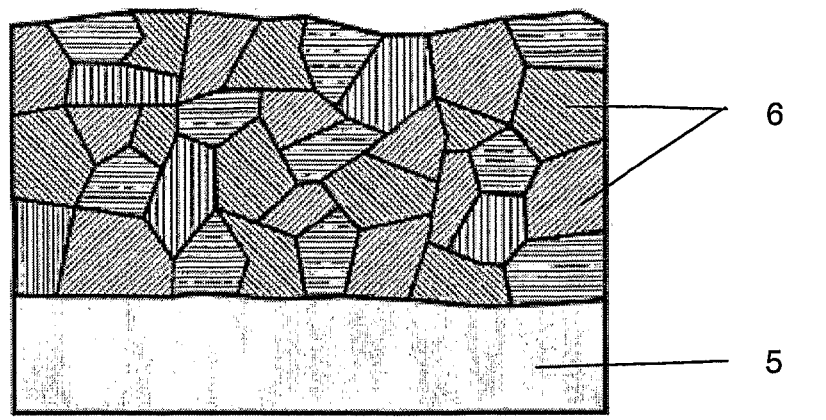
FIG. 4: Sketches of the microstructures that are achievable by aluminum-chromium-transition metal nitrides: (a) polycrystalline (b) textured (c) nanocomposite.
Figure 4:
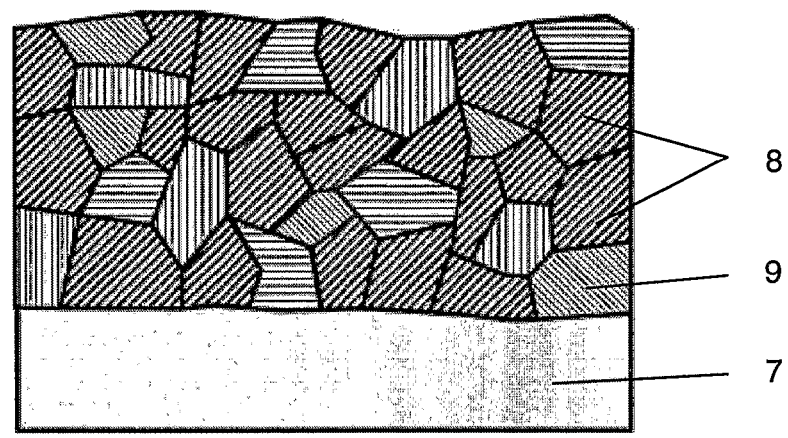
Figure 4:
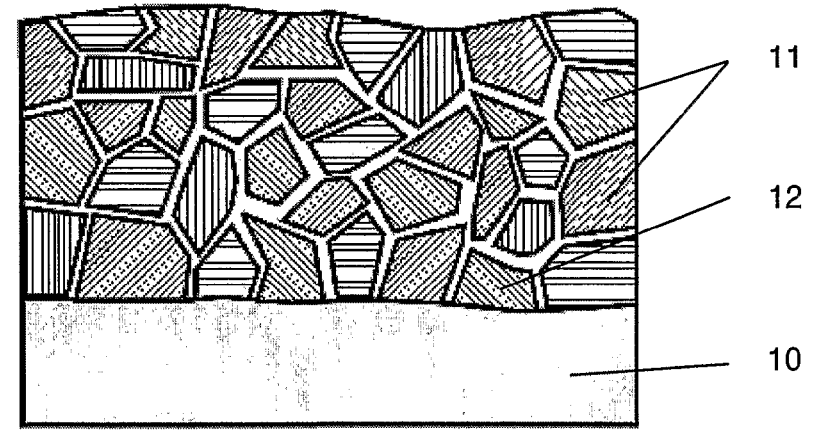

Another effect of transition metal doping into an AlCrN B1-structure can be the development of a (200) texture during film growth. This is what occurred, for instance, with the XRD pattern for AlCrNbN (FIG. 2) which shows a (200) preferred orientation in comparison to the more polycrystalline structure exhibited by pure AlCrN. In FIG. 3, the diffraction ratio QI (defined as the ratio of the diffraction intensity for the (200) plane with respect to the diffraction intensity of the (111) plane) is shown for the AlCrN and for two AlCrMoN compositions. Increasing the molybdenum content in an AlCrN with a B1-structure resulted on higher QI ratios. Controlling the texture and structure of a protective hard film is, technologically, very desirable because the shape of the stress field varies significantly from one application to the next. Also, unlike ref. [B], here the preferred orientation is predominantly controlled by the stoichiometry of the coatings. The main structural arrangements that can be achieved by the compositions claimed in this invention are represented schematically in FIG. 4. In FIG. 4(*a*), a polycrystalline film composed of randomly oriented crystallites 6 are grown on top of a cemented carbide or a steel substrate 5. A second possibility is that a textured film is grown on a substrate 5, being the portion of crystallites oriented in a particular plane 8 is several factors greater than the disoriented ones 9. The third possible microstructural arrangement (FIG. 4(*c*)) can be achieved by co-depositing a metalloid (either Si or B) leading to the formation of covalently bonded nitrides and to the creation of a separate amorphous or semi-crystalline phase 12 that surrounds the crystallites 11 with the resulting further increase in hardness.

Figure 5:
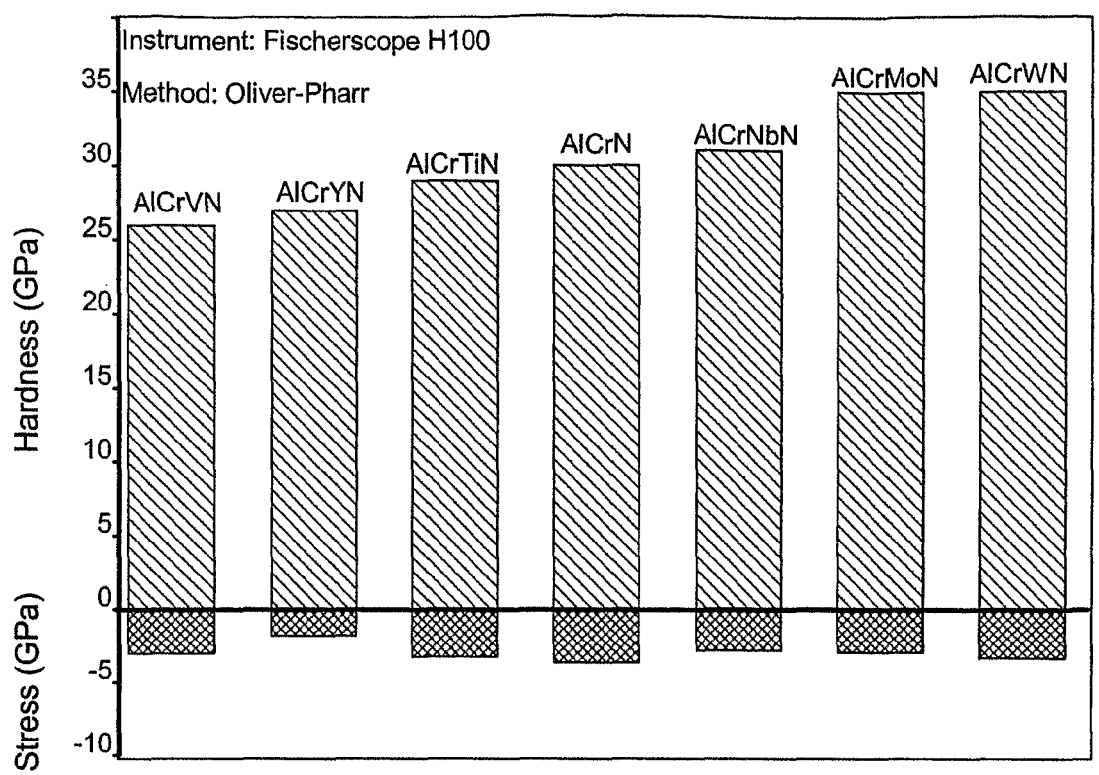
FIG. 5: Hardness and residual stress measurements for aluminum-chromium-transition metal nitrides.

Hardness tests of the deposited hard layers were conducted with a Fischerscope H100 depth-sensing microhardness instrument using a test load of 50 mN. In addition, the residual stress was calculated by measuring the curvature of thin planar steel substrates by the three point bend test before and after the deposition. The plot in FIG. 5 shows the values obtained for a variety of AlCrXN compositions. Results in FIG. 5 indicate a beneficial strengthening effect when low amounts of Nb, Mo and W are alloyed into AlCrN without any further increase in the residual stress of the coating. This surprising mechanical behavior can be in part explained by the mechanisms of solid solution hardening and the solubility of these elements into B1-AlCrN observed in our experiments as explained above.

Figure 6:
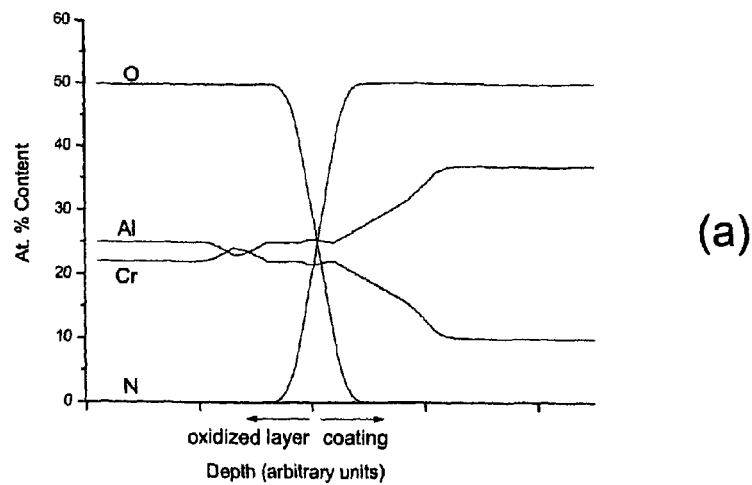
FIG. 6: Secondary ion mass spectrometer depth profiles: (a) typical oxidized surface (b) poor oxidized surface (c) optimal oxidized surface.
Figure 6:
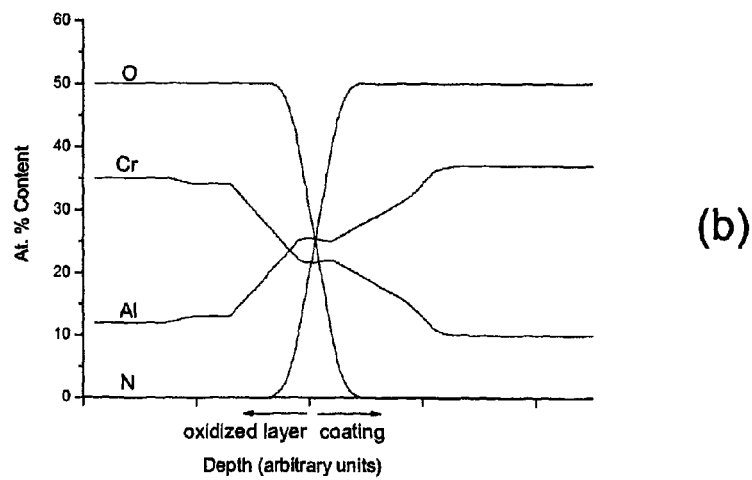
Figure 6:
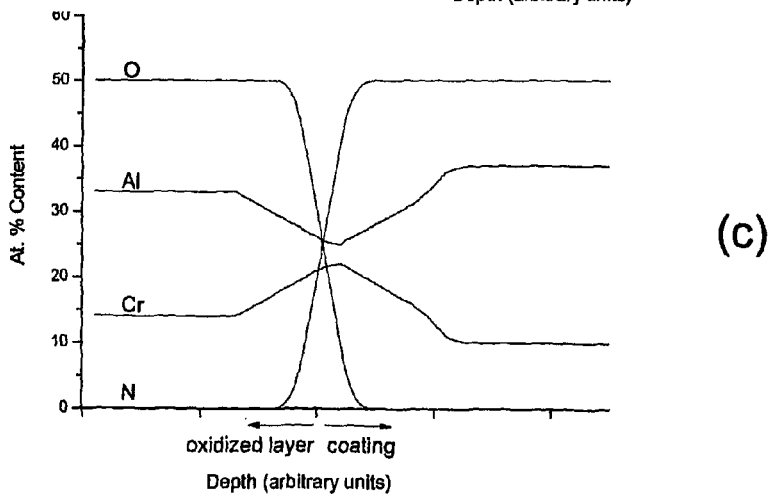

Another important coating property in high speed or high feed cutting applications and in machining of austenitic stainless steels and titanium and nickel alloys is the resistance of a coating to oxidation at high temperatures and the characteristics of the third body layer that forms between coating and workpiece material during cutting that can influence the chip formation process. To investigate the oxidation behavior of the alloyed AlCrN coatings, annealing experiments in flowing air during one hour at 900° C. were carried out. These experiments were followed by secondary ion mass spectrometer depth profile analysis of the oxidized surface layers. FIG. 6(a) illustrates the depth profile for a typical oxidation behavior of a standard AlCrN coating with the formation of both chromium and aluminum oxides. This typical behavior was exhibited not only by the unalloyed AlCrN coating but by the AlCrTiN coating as well. Nevertheless, some of the alloyed AlCrXN coatings had a tendency to form mostly chromium oxides as it can be inferred from FIG. 6(b). This indicates a poor oxidation resistance behavior since chromium oxides are generally weaker and less resistant to corrosion than aluminum oxides, and therefore they can be easily removed during cutting and/or molding processes. This oxidation behavior was observed in AlCrYN and AlCrVN coatings. On the other hand, AlCrNbN, AlCrMoN, and AlCrWN coatings showed a more optimal oxidation behavior (shown in FIG. 6(c)), where the amount of aluminum in the outer oxidized layer is similar to the aluminum content of the unoxidized part. This indicates the formation of stiff passive aluminum oxides which can be very desirable in many cutting applications.

Figure 7:
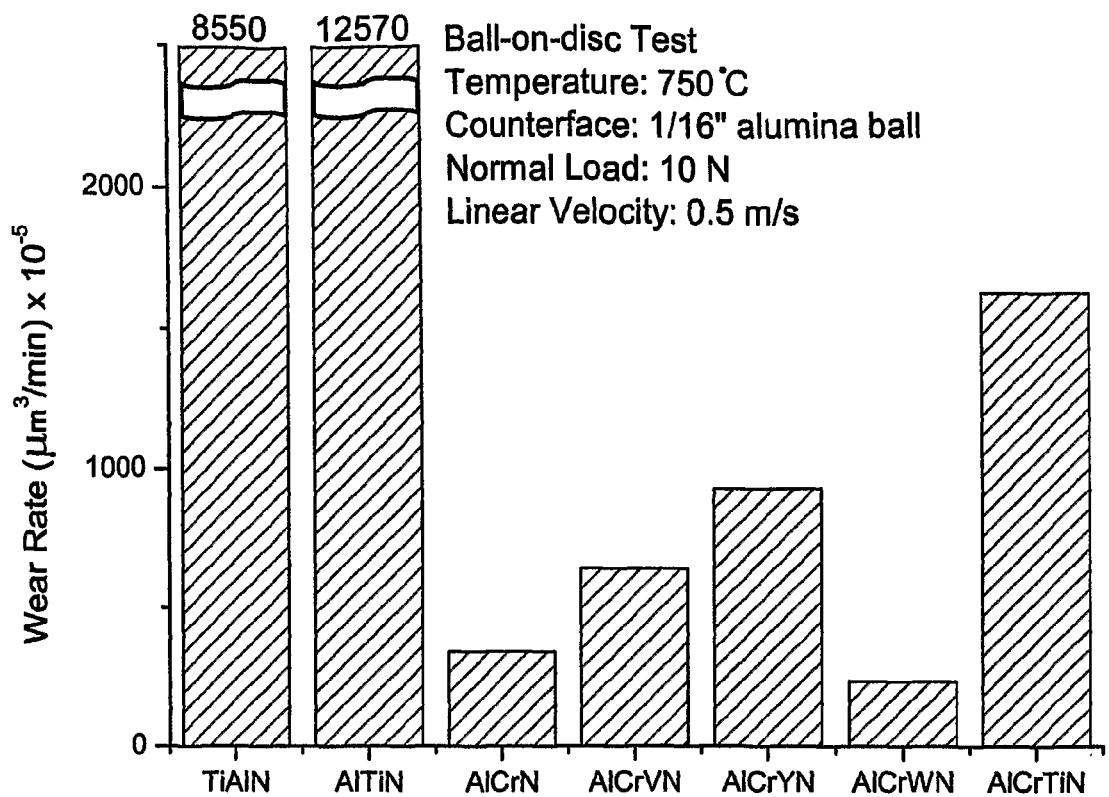
FIG. 7: High temperature wear-resistance ball-on-flat tests for aluminum-chromium-transition metal nitrides.

Since the temperature of application of the new improved AlCrXN coatings is meant to be high, the wear resistance of the deposited layer was studied using a ball-on-disc test using a hard alumina ball counterface at high temperature and measuring the wear on the coating after a predetermined number of cycles. In FIG. 7, the wear rate of a variety of AlCrXN coatings is shown in comparison to TiAlN, AlTiN and AlCrN. The results also indicate that AlCrWN have the lowest wear of the set, even lower than the one corresponding to the pure AlCrN coating.

Based on the mechanical test results that were just presented, the behavior of AlCr based coatings can be further improved by the alloying of Nb, Mo, W or Ta. In other words, by including transition metals from group Vb and VIb being heavier than chromium. The best results can be reached when the atomic concentration of these elements is between 2 and 10 percent of the metallic part, however an atomic concentration as low as 1 percent and as high as 20 percent would be possible. The presence of these alloying elements ultimately ensures good solubility, an increased hardness, and an optimal high temperature oxidation behavior. This decreases the abrasive, diffusion and oxidational wear of coated mechanical components and cutting tools at high temperatures. Similar results were also reached by the addition of small amounts of metalloids like silicon and/or boron and should also consequently be reached by analogous alloyed carbides, carbonitrides, carbon oxides, etc. Hence, the actual invention refers to novel coatings and corresponding coated tools and components, having the coating the following global composition:

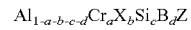

Where:
X is at least one element from Nb, Mo, W, Ta;
Z means N, C, CN, NO, CO, CNO;
0.2<=a<=0.5
0.01<=b<=0.2
0<=c<=0.1
0<=d<=0.1

It is further possible to deposit gradient coatings for instance with an Al-content increasing toward the surface, either by using two types of targets with different Al/Cr ratios or, starting with a Cr and Cr and or Cr/N bonding layer, bridging about a progressive change in layer composition for instance by a continous or stepwise adjustment of the corresponding target output in a coating chamber equipped with both Cr and AlCr targets. The important factor for industrial application of this type of coatings is the ability to reproducibly adjust the process parameters essentially over the entire progression of the coating process and thus the entire thickness of the film. Minor compositional fluctuations occurring for instance on a single- or multiple rotation substrate carrier can be additionally utilized for producing a nanostructure over part or all of the thickness of the layer, i.e. for lamination in the nano or micrometer range.

Example 1

Milling of Tool Steel—Roughing

Cutting tool: end Mill HSS roughing, diameter D=10 mm, Number of teeth z=4
Work piece: Tool Steel, X 40 CrMoV 5 1, DIN 1.2344 (36 HRC)
Cutting parameter:
    Cutting speed $v_c$=60 m/min (S=1592 1/min),
    Feed rate fz=0.05 mm/U (f=318.4 mm/min)
    Radial depth of cut $a_e$=3 mm
    Axial depth of cut $a_p$=5 mm
Cooling: Emulsion 5%
Process: down milling
Tool life criterion: Momentum shut down (correlates with width of flank wear land VB>0.3 mm)

| Experiment Nr. | Alloy Elem. | Alloy. Elem. | Chemical Composition by EDS (at. %) | | | | | Meters until Torque max [m] |
|---|---|---|---|---|---|---|---|---|
| | | | Titanium | Aluminum | Chromium | Carbon | Nitrogen | |
| 1 TiCN * | — | | 48 | — | — | 34 | 18 | 9.1 |
| 2 TiAlN * | — | | 29 | 33 | — | — | 38 | 5.5 |
| 3 AlTiN * | — | | 23 | 40 | — | — | 37 | 9.0 |

-continued

|  |  |  | Chemical Composition by EDS (at. %) |  |  |  |  | Meters until Torque max [m] |
|---|---|---|---|---|---|---|---|---|
| Experiment Nr. | Alloy Elem. | Alloy. Elem. | Titanium | Aluminum | Chromium | Carbon | Nitrogen |  |
| 4 AlCrN * | — | — | — | 43 | 26 | — | 31 | 15.1 |
| 5 AlCrYN [C] | Y | 5 | — | 43 | 21 | — | 30 | 12.6 |
| 6 AlCrVN [C] | V | 4 | — | 44 | 22 | — | 30 | 13.3 |
| 7 AlCrNbN | Nb | 5 | — | 42 | 21 | — | 32 | 18.7 |
| 8 AlCrWN | W | 4 | — | 44 | 22 | — | 31 | 18.0 |
| 9 AlCrMoN | Mo | 4 | — | 43 | 22 | — | 30 | 19.4 |

\* denotes state of the art coatings.
[C] denotes comparative examples

Example 1 shows the increased tool lifetime in meters of AlCrN based coatings compared to industrially used TiCN, TiAlN and AlTiN coatings. AlCrNbN, AlCrWN and AlCrMoN can be very beneficial when applied to a ductile type substrate like high speed steel because they provide a surface of high hardness and an adequate adhesion.

Example 2 shows the comparison of various AlCrXN coatings in HSS coated drills. Main tool life criterion is the standardized number of drilled holes over the coatings thickness until a predetermined maximum momentum is reached. The best coefficient of performance was shown by Nb, W and Mo alloyed AlCr-based coatings.

Example 2

Drilling Tool Steel

Cutting tool: Drill HSS (S 6-5-2), Diameter D=6 mm
Work piece: Tool Steel X 210 Cr 12, DIN 1.2080 (230HB)
Cutting parameter:
    Cutting speed $v_c$=35 m/min
    Feed rate f=0.12 mm
    Drill hole depth z=15 mm, blind hole
Cooling: Emulsion 5%
Tool life criterion: Momentum shut down (correlates with width of edge wear VBc>0.3 mm

Example 3

Milling Low Alloyed Steel—Semi Finishing

Cutting tool: end mill carbide, diameter D=8 mm,
    Number of teeth z=3
Work piece: carbon steel Ck45, DIN 1.1191
Cutting Parameter:
    Cutting speed $v_c$=400 m/min
    Feed speed $v_f$=4776 mm/min
    Radial depth of cut $a_e$=0.5 mm
    Axial depth of cut $a_p$=10 mm
Cooling: Emulsion 5%
Process: down milling
Tool life criterion: width of flank wear land VB=0.12 mm

|  |  |  |  |  | Chemical Composition by EDS (at. %) |  |  |  |  | Wear life (holes/μm coating thickness) |
|---|---|---|---|---|---|---|---|---|---|---|
| Experiment Nr. | Alloy Elem 1 | Alloy Elem. 2 | Alloy. Elem. 1 | Alloy Elem. 2 | Ti | Al | Cr | C | N |  |
| 10 TiCN * | — | — | — | — | 48 | — | — | 34 | 18 | 50 |
| 11 TiAlN * | — | — | — | — | 29 | 33 | — | — | 38 | 64 |
| 12 AlTiN * | — | — | — | — | 23 | 40 | — | — | 37 | 73 |
| 13 AlCrN * | — | — | — | — | — | 43 | 26 | — | 31 | 92 |
| 14 AlCrYN [C] | Y | — | 5 | — | — | 43 | 21 | — | 30 | 72 |
| 15 AlCrVN [C] | V | — | 4 | — | — | 44 | 22 | — | 30 | 84 |
| 16 AlCrNbN | Nb | — | 5 | — | — | 42 | 21 | — | 32 | 110 |
| 17 AlCrWN | W | — | 4 | — | — | 44 | 22 | — | 31 | 102 |
| 18 AlCrMoN | Mo | — | 4 | — | — | 43 | 22 | — | 30 | 109 |
| 19 AlCrNbBN | Nb | B | 2 | 3 | — | 43 | 20 | — | 32 | 107 |
| 20 AlCrMoBN | Mo | B | 2 | 3 | — | 42 | 21 | — | 32 | 114 |
| 21 AlCrMoSiN | Mo | Si | 3 | 3 | — | 42 | 22 | — | 30 | 116 |

\* denotes state of the art coatings.
[C] denotes comparative examples

| Experiment Nr. | Alloy Elem 1 | Alloy Elem. 2 | Alloy. Elem. 1 | Alloy Elem. 2 | Chemical Composition by EDS (at. %) | | | | | Flank Wear after 150 m (mm). |
|---|---|---|---|---|---|---|---|---|---|---|
| | | | | | Ti | Al | Cr | C | N | |
| 22 TiCN * | — | — | — | — | 48 | — | — | 34 | 18 | 0.140 |
| 23 TiAlN * | — | — | — | — | 29 | 33 | — | — | 38 | 0.110 |
| 24 AlTiN * | — | — | — | — | 23 | 40 | — | — | 37 | 0.130 |
| 25 AlCrN * | — | — | — | — | — | 43 | 26 | — | 31 | 0.050 |
| 26 AlCrYN $^C$ | Y | — | 5 | — | — | 43 | 21 | — | 30 | 0.100 |
| 27 AlCrNbN | Nb | — | 5 | — | — | 42 | 21 | — | 32 | 0.050 |
| 28 AlCrWN | W | — | 4 | — | — | 43 | 22 | — | 30 | 0.060 |
| 29 AlCrMoN | Mo | — | 4 | — | — | 43 | 20 | — | 32 | 0.065 |
| 30 AlCrWBN | W | B | 2 | 3 | — | 42 | 21 | — | 32 | 0.030 |
| 31 AlCrNbSiN | Nb | Si | 2 | 3 | — | 42 | 22 | — | 30 | 0.050 |

* denotes state of the art coatings.
$^C$ denotes comparative examples

Example 3 shows a comparison of the tool life of coated cemented carbide end mills during finishing of plain carbon steel. While standard industrially used layer systems, such as TiCN, TiAlN and AlTiN coatings show a high flank wear after a tool life of if =150 m, tools coated with coatings' combinations based on the formula Al1-a-b-c-d Cra Xb SicZ exhibited significantly lower wear. These results indicate that $Al_{1-a-b-c-d}Cr_aX_bSi_cZ$ coatings can adequately resist the high induced thermal impacts of high speed machining processes.

Example 4

Milling of Austenitic Stainless Steel—Roughing

Cutting tool: end mill carbide, Diameter D=10 mm, number of teeth z=4
Work piece: austenitic stainless steel X 6 CrNiMoTi 17 12 2, DIN 1.4571
Cutting parameter:
  Cutting speed $v_c$=67 m/min
  Feed rate $f_z$=0.033 mm
  Radial depth of cut $a_e$=6 mm
  Axial depth of cut $a_p$=9 mm
Cooling: Emulsion 5%
Process: down milling
Tool life criterion: width of flank wear land VB=0.2 mm

| Experiment Nr. | Alloy Elem. | Alloy. Elem. | Chemical Composition by EDS (at. %) | | | | | Meters until failure |
|---|---|---|---|---|---|---|---|---|
| | | | Titanium | Aluminum | Chromium | Carbon | Nitrogen | |
| 32 TiCN* | — | — | 48 | — | — | 34 | 18 | 22 |
| 33 TiAlN* | — | — | 29 | 33 | — | — | 38 | 15.5 |
| 34 AlTiN* | — | — | 23 | 40 | — | — | 37 | 31 |
| 35 AlCrN* | — | — | — | 43 | 26 | — | 31 | 21 |
| 36 AlCrNbN | Nb | 5 | — | 42 | 21 | — | 32 | 43.5 |
| 37 AlCrMoN | Mo | 4 | — | 43 | 22 | — | 30 | 39.5 |
| 38 AlCrWN | W | 4 | — | 44 | 22 | — | 31 | 43.0 |

*denotes state of the art coatings.

Example 4 shows the comparison in tool life of coated cemented carbide end mills against stainless steel for four industrially used hard layer systems. Machining of stainless steel is a very difficult process due to its high toughness of this material, tendency to work harden and to adhere to the tool. The best results in terms of tool life were reached using AlCrNbN, AlCrMoN and AlCrWN coatings. This increased tool life could be related to both an increase in hardness at high temperatures and the good oxidation behavior exhibited with the use of Nb, Mo and W alloyed AlCrN systems, consequently increasing the wear resistance.

The invention claimed is:

1. A workpiece having a surface wherein at least parts of said surface are coated with a wear resistant hard coating comprising a coating of the following composition $Al_{1-a-b-b-d}Cr_aX_bSi_cB_dZ$, where X is at least one element from Nb, Mo, W or Ta;
Z is one element or compound from N, C, CN, NO, CO, CNO;
and $0.2<=a<=0.5$;
$0.01<=b<=0.2$;
$0<=c<=0.1$;
$0<=d<=0.1$.

2. A workpiece according to claim 1 having a body made from steel, high speed steel, hardmetal, cemented carbide, or any other metal or ceramics.

3. A workpiece according to claim 1 wherein the workpiece is a tool for high temperature and/or dry tooling operation.

4. A workpiece according to claim 1 wherein the workpiece is a tool, a cutting tool, a drill, a reamer, a broach, an insert, a hob, a mill, an endmill, a ball nose mill, a forming tool, a die casting mold, an injection mold, a stamping tool, a deep drawing tool, a forging die.

5. A workpiece according to claim 1 wherein the workpiece is a component for heavy duty, high temperature, insufficient lubrication and/or dry running conditions.

6. A workpiece according to claim 1 wherein the workpiece is a component, a tappet, a component of the valve train, a tappet, a valve lever, a rocker arms, a pin, a bolt, a component of a fuel injection system, an injection needle, a gear, a pinion gear, a plunger, a piston ring.

7. A workpiece according to claim 6 wherein the tappet is a bucket tappet.

8. A workpiece according to claim 6 wherein the pin is a piston pin or a roller follower pin.

9. PVD process for depositing at least one $Al_{1-a-b-c-d}Cr_a X_b Si_c B_d Z$ film on a workpiece, where X is at least one element from Nb, Mo, W or Ta; Z is one element or compound from N, C, CN, NO, CO, CNO; and $0.2<=a<=0.5$; $0.01<=b<=0.2$; $0<=c<=0.1$; $0<=d<=0.1$, whereby at least one workpiece is installed in a vacuum coating system and said system is operated in a low pressure argon atmosphere utilizing at least two metal or metal alloy targets with at least temporarily addition of at least one reactive gas, applying at the substrate a negative voltage.

10. PVD process according to claim 9, whereby the reactive gas is nitrogen at a partial pressure of about 3.5 Pa.

11. PVD process according to claim 10, whereby the substrate voltage is −100 V.

12. PVD process according to claim 10, whereby the at least two targets comprise Al and Cr.

13. PVD process according to claim 9, whereby the substrate voltage is −100 V.

14. PVD process according to claim 13, whereby the at least two targets comprise Al and Cr.

15. PVD process according to claim 9, whereby the at least two targets comprise Al and Cr.

* * * * *

UNITED STATES PATENT AND TRADEMARK OFFICE
CERTIFICATE OF CORRECTION

PATENT NO. : 8,318,328 B2
APPLICATION NO. : 11/572118
DATED : November 27, 2012
INVENTOR(S) : Jose Endrino et al.

It is certified that error appears in the above-identified patent and that said Letters Patent is hereby corrected as shown below:

In the Specification:

In column 2, line 54, delete "Baizers" and insert -- Balzers --

In column 9, line 23, delete "if" and insert -- 1f --

In the Claims:

In column 10, line 31, delete "$Al_{1-a-b-b-d} Cr_a X_b Si_c B_d Z$" and insert -- $Al_{1-a-b-c-d} Cr_a X_b Si_c B_d Z$ --

Signed and Sealed this
Fourth Day of June, 2013

Teresa Stanek Rea
*Acting Director of the United States Patent and Trademark Office*